US011322553B2

(12) United States Patent
Song et al.

(10) Patent No.: US 11,322,553 B2
(45) Date of Patent: May 3, 2022

(54) DISPLAY APPARATUS INCLUDING COLOR-CONVERSION LAYER AND FILTER LAYER STACKED IN DIFFERENT INSULATING LAYERS

(71) Applicant: SAMSUNG DISPLAY CO., LTD., Yongin-si (KR)

(72) Inventors: Jungbae Song, Yongin-si (KR); Kwanghyun Kim, Yongin-si (KR); Dahye Kim, Yongin-si (KR); Byoungki Kim, Yongin-si (KR); Heekwang Song, Yongin-si (KR); Yunmo Chung, Yongin-si (KR); Kangmoon Jo, Yongin-si (KR); Younho Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 42 days.

(21) Appl. No.: 16/898,867

(22) Filed: Jun. 11, 2020

(65) Prior Publication Data

US 2021/0143222 A1  May 13, 2021

(30) Foreign Application Priority Data

Nov. 11, 2019  (KR) .................. 10-2019-0143665

(51) Int. Cl.
*H01L 27/32* (2006.01)
*H01L 51/50* (2006.01)
*H01L 51/56* (2006.01)
*H01L 51/52* (2006.01)

(52) U.S. Cl.
CPC ........ *H01L 27/322* (2013.01); *H01L 27/3218* (2013.01); *H01L 51/502* (2013.01); *H01L 51/5284* (2013.01); *H01L 51/56* (2013.01)

(58) Field of Classification Search
CPC . H01L 27/322; H01L 27/3218; H01L 51/502; H01L 51/5284; H01L 51/5036; H01L 51/56
USPC ........................................................ 257/40
See application file for complete search history.

(56) References Cited

U.S. PATENT DOCUMENTS

| 7,985,607 B2 | 7/2011 | Kim et al. |
| 9,897,854 B2 | 2/2018 | Lee et al. |
| 2018/0059485 A1 | 3/2018 | Nam et al. |
| 2018/0179441 A1 | 6/2018 | Park et al. |
| 2020/0212109 A1* | 7/2020 | Lee ...................... H01L 27/322 |

(Continued)

FOREIGN PATENT DOCUMENTS

| KR | 101462652 B1 | 11/2014 |
| KR | 1020160084793 A | 7/2016 |

(Continued)

*Primary Examiner* — Matthew E. Gordon
(74) *Attorney, Agent, or Firm* — Cantor Colburn LLP

(57) ABSTRACT

A display apparatus includes a first pixel, a second pixel, and a third pixel which emit light of different colors from one another, a first insulating layer on a first display element of the first pixel, and a second insulating layer on the first insulating layer. The first insulating layer defines a first opening portion corresponding to the first display element, the second insulating layer defines a first opening corresponding to the first opening portion, and the first opening portion has a first extension portion which extends in a first direction and at least partially exposes the second insulating layer.

12 Claims, 16 Drawing Sheets

(56) References Cited

U.S. PATENT DOCUMENTS

| | | | | |
|---|---|---|---|---|
| 2021/0104578 A1* | 4/2021 | Jo | ................... | H01L 51/5284 |
| 2021/0134906 A1* | 5/2021 | Lee | ................... | H01L 27/3248 |
| 2021/0305322 A1* | 9/2021 | Song | ................... | H01L 27/3258 |
| 2021/0327964 A1* | 10/2021 | Jeon | ................... | H01L 27/3262 |
| 2021/0359078 A1* | 11/2021 | Kim | ................... | H01L 27/322 |

FOREIGN PATENT DOCUMENTS

| KR | 101768104 B1 | 8/2017 |
|---|---|---|
| KR | 1020170096583 A | 8/2017 |
| KR | 1020180025388 A | 3/2018 |
| KR | 1020180077086 A | 7/2018 |
| KR | 101965157 B1 | 4/2019 |

\* cited by examiner

DISPLAY APPARATUS INCLUDING COLOR-CONVERSION LAYER AND FILTER LAYER STACKED IN DIFFERENT INSULATING LAYERS

This application claims priority to Korean Patent Application No. 10-2019-0143665, filed on Nov. 11, 2019, and all the benefits accruing therefrom under 35 U.S.C. § 119, the content of which in its entirety is herein incorporated by reference.

BACKGROUND

1. Field

One or more exemplary embodiments relate to a display apparatus and a method of manufacturing the display apparatus, and more particularly, to a display apparatus having improved color reproducibility and a simple method of manufacturing the display apparatus.

2. Description of Related Art

A display apparatus visually displays data. A display apparatus may be used as a display in a small-sized product such as a mobile phone, or a display in a large-sized product such as a television.

A display apparatus includes a plurality of pixels that emit light by receiving electrical signals in order to externally display images. Each of the pixels includes a display element. For example, in an organic light-emitting display apparatus, the display element is an organic light-emitting diode ("OLED").

Recently, usage of display apparatuses has increased, and various designs have been tried for improving the quality of display apparatuses. In particular, as the resolution of a display apparatus increases, research has been actively conducted in order to improve color reproduction of each pixel in a display apparatus.

SUMMARY

However, according to a display apparatus and a method of manufacturing the display apparatus of the related art, the time taken for each manufacturing process (i.e., tack time) increases depending on the pixel arrangement.

One or more exemplary embodiments include a display apparatus which may be manufactured by a simple manufacturing method and has improved color reproducibility, and a method of manufacturing the display apparatus. However, the above technical features are exemplary, and the scope of the disclosure is not limited thereto.

Additional aspects will be set forth in part in the description which follows and, in part, will be apparent from the description, or may be learned by practice of the presented exemplary embodiments of the disclosure.

According to one or more exemplary embodiments, a display apparatus includes a first pixel, a second pixel, and a third pixel which emit light of different colors from one another, a first insulating layer on a first display element of the first pixel and which defines a first opening portion corresponding to the first display element, a second insulating layer on the first insulating layer and which defines a first opening corresponding to the first opening portion, a first color conversion layer disposed in the first opening and which includes first quantum dots for converting incident light into first color light, and a first filter layer on the first color conversion layer, where the first opening portion has a first extension portion that extends in a first direction and at least partially exposes the second insulating layer.

The display apparatus may further include a second color conversion layer which corresponds to a second display element of the second pixel and includes second quantum dots for converting the incident light into second color light, and a second filter layer on the second color conversion layer. The first insulating layer may further define a second opening portion corresponding to the second display element of the second pixel, the second insulating layer may further define a second opening corresponding to the second opening portion, the second color conversion layer may be located in the second opening, and the second opening portion may include a second extension portion which extends in a second direction opposite to the first direction and at least partially exposes the second insulating layer.

The display apparatus may further include a transmission layer which corresponds to a third display element of the third pixel and includes scattering particles for scattering the incident light, and a third filter layer on the transmission layer, where the first insulating layer may further define a third opening portion corresponding to the third display element of the third pixel, the second insulating layer may further define a third opening corresponding to the third opening portion, the transmission layer may be located in the third opening, and the third opening portion may include a third extension portion which extends in the first direction at least partially exposes the second insulating layer.

The first extension portion, the second extension portion, and the third extension portion may have the same width in the first direction or the second direction.

A first emission area of the first pixel, a second emission area of the second pixel, and a third emission area of the third pixel may have square shapes in a plan view.

Extension lines which connect a center of one of the first emission area, the second emission area, and the third emission area to centers of the other two emission areas may cross one another in a plan view.

At least one of the first insulating layer and the second insulating layer may include a light-blocking material.

A surface of the second insulating layer, which is exposed by the first extension portion, may have a hydrophobic property.

A surface of the second insulating layer, which is exposed by the first extension portion, may be inclined.

The first insulating layer and the second insulating layer may be integrally provided with each other.

A surface of the second insulating layer, which is exposed by the first extension portion, may have a hydrophobic property.

A surface of the second insulating layer, which is exposed by the first extension portion, may be inclined.

According to one or more exemplary embodiments, a method of manufacturing a display apparatus includes manufacturing a display unit, manufacturing a color filter unit, and bonding the display unit to the color filter unit, where the manufacturing of the color filter unit includes forming a light-blocking layer on an upper substrate, forming a first filter layer in a hole defined by the light-blocking layer, forming a second insulating layer defining a first opening on the light-blocking layers, forming a first insulating layer defining a first opening portion on the second insulating layer, where the first opening portion has a first extension portion which extends in a first direction and at least partially exposes the second insulating layer, and forming a first color conversion layer in the first opening, the first color conversion layer including first quantum dots for converting incident light into first color light.

The method may further include processing a surface of the second insulating layer to have a hydrophobic property, wherein the surface may be exposed by the first extension portion.

The method may further include processing a surface of the second insulating layer to be inclined, wherein the surface may be exposed by the first extension portion.

The forming of the first insulating layer and the forming of the second insulating layer may be performed simultaneously.

The forming of the first insulating layer and the forming of the second insulating layer may be performed by using a half-tone mask.

The method may further include processing a surface of the second insulating layer to have a hydrophobic property, wherein the surface may be exposed by the first extension portion.

The forming of the first color conversion layer may be performed by an inkjet printing method.

At least one of the first insulating layer and the second insulating layer may include a light-blocking material.

BRIEF DESCRIPTION OF THE DRAWINGS

The above and other aspects, features, and advantages of certain exemplary embodiments of the disclosure will be more apparent from the following description taken in conjunction with the accompanying drawings, in which.

DETAILED DESCRIPTION

Figure 1:
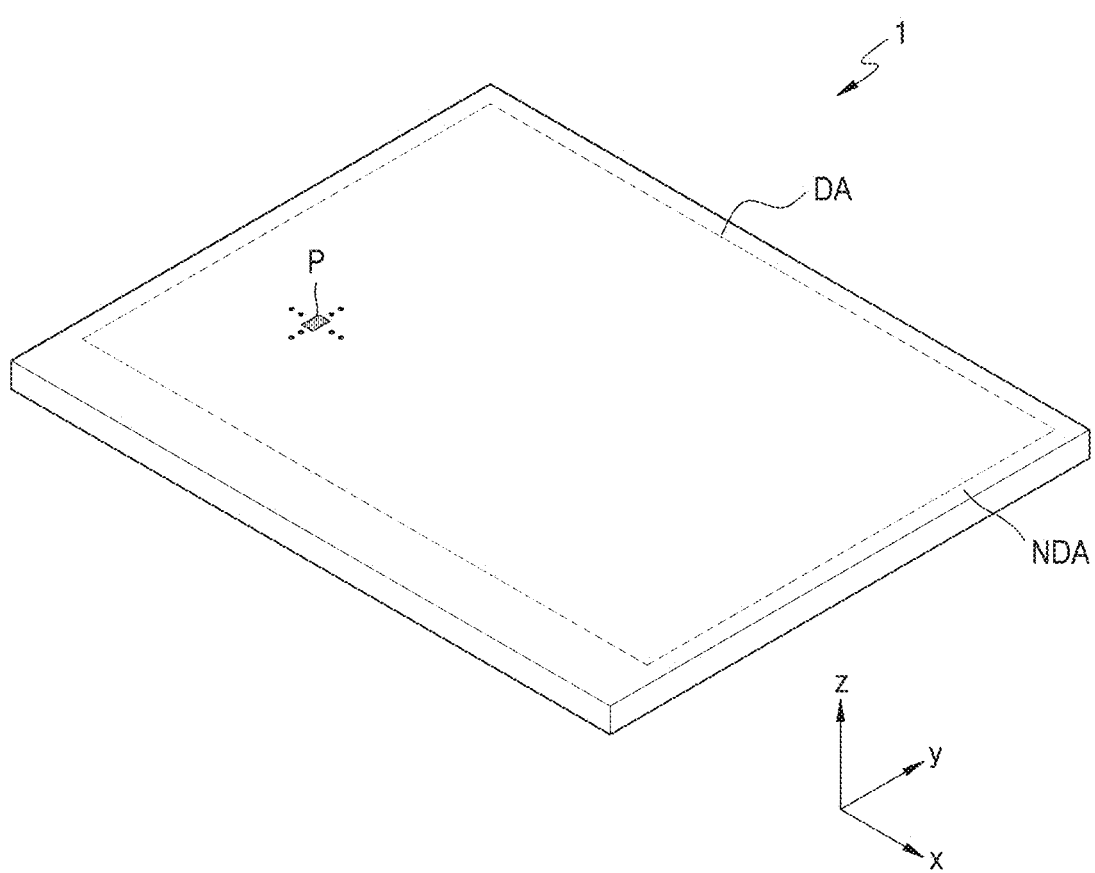
FIG. 1 is a perspective view of a display apparatus according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The exemplary embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following exemplary embodiments are not limited thereto.

When a certain exemplary embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the exemplary embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, one or more exemplary embodiments of the disclosure will be described in detail with reference to accompanying drawings.

FIG. 1 is a perspective view of a display apparatus 1 according to an exemplary embodiment.

Referring to FIG. 1, the display apparatus 1 includes a display area DA and a non-display area NDA. The display area DA displays images and the non-display area NDA does not display images. The display apparatus 1 may provide images by using light emitted from the display area DA.

In FIG. 1, the display apparatus 1 includes the display area DA having a square shape, but the invention is not limited thereto. In an exemplary embodiment, the display area DA may have a circular shape, an elliptical shape, or a polygonal shape such as a triangle, a quadrangle, a pentagon, etc. Also, the display apparatus 1 of FIG. 1 includes a flat panel display apparatus, but the display apparatus 1 may be implemented as various types, e.g., a flexible display apparatus, a foldable display apparatus, a rollable display apparatus, etc.

Hereinafter, the display apparatus 1 according to an exemplary embodiment is described as an organic light-emitting display apparatus as an example, but the display apparatus according to the invention is not limited thereto. In another exemplary embodiment, the display apparatus may include an inorganic light-emitting display, an inorganic electroluminescence ("EL") display apparatus, or a quantum dot light-emitting display apparatus. For example, a light-emitting layer of a display element included in the display apparatus 1 may include an organic material, an inorganic material, quantum dots, an organic material and quantum dots, an inorganic material and quantum dots, or an organic material, an inorganic material, and quantum dots.

A plurality of pixels P may be disposed in the display area DA. In the specification, each pixel P may denote a sub-pixel emitting light of a different color from the others, and each pixel P may be one of, for example, a red (R) sub-pixel, a green (G) sub-pixel, and a blue (B) sub-pixel.

Figure 2:
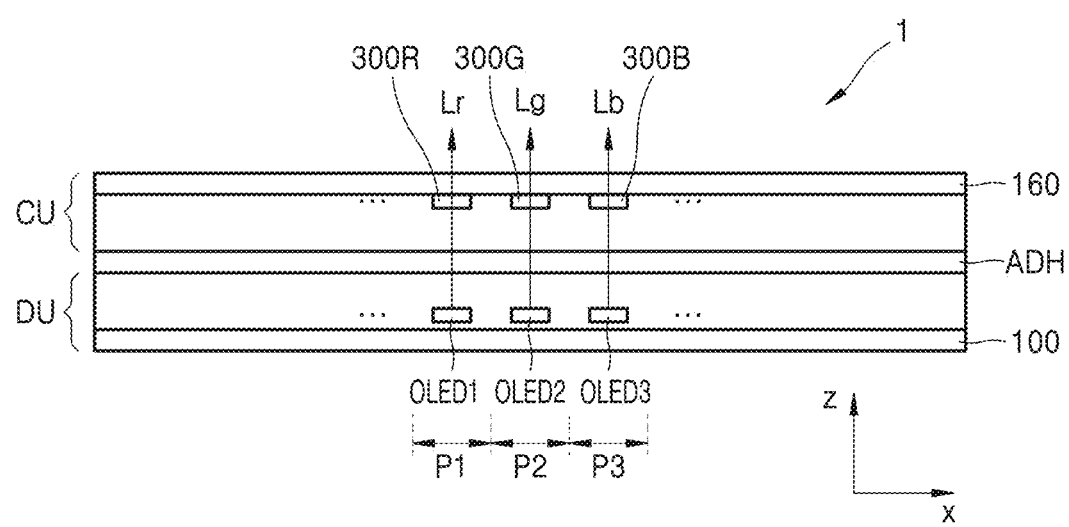
FIG. 2 is a cross-sectional view of the display apparatus according to an exemplary embodiment.
Figure 3:
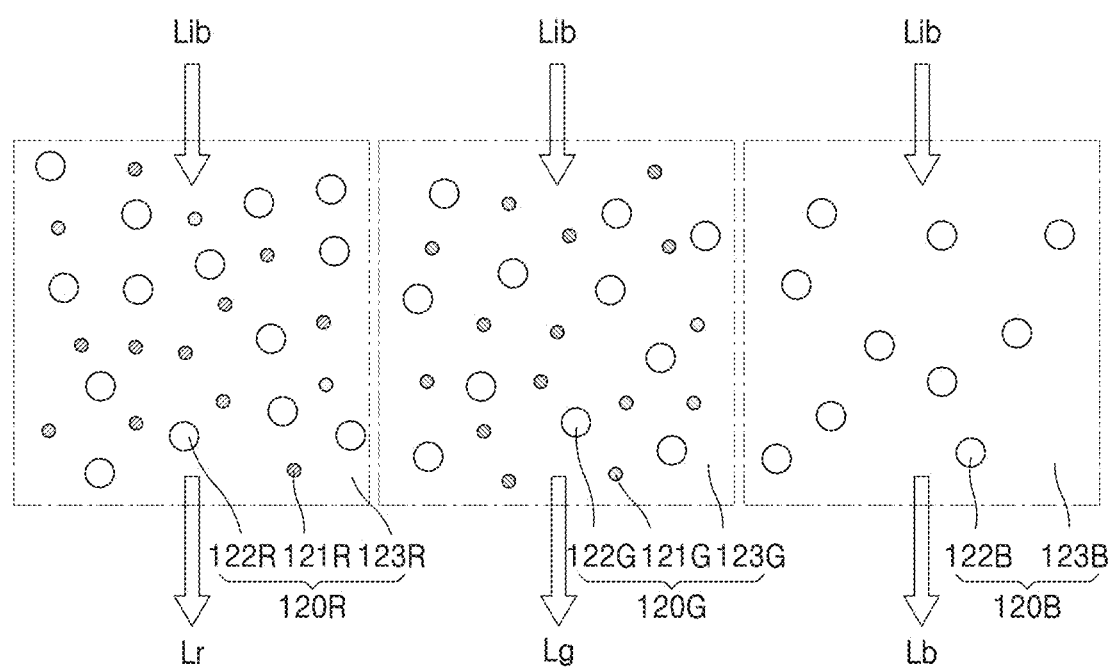
FIG. 3 is an enlarged view showing a part of a display apparatus according to an exemplary embodiment.

FIG. 2 is a cross-sectional view of the display apparatus 1 according to an exemplary embodiment, and FIG. 3 is an enlarged view partially showing the display apparatus 1 according to an exemplary embodiment. FIG. 3 shows an enlarged view of first and second color conversion layers 120R and 120G and a transmission layer 120B.

Referring to FIG. 2, the display apparatus 1 includes a display unit DU and a color filter unit CU facing the display unit DU. The display unit DU may include a first pixel P1, a second pixel P2, and a third pixel P3 on a substrate 100. The first pixel P1, the second pixel P2, and the third pixel P3 may emit different color light from one another on the substrate 100, respectively. For example, the first pixel P1 may emit red light Lr, the second pixel P2 may emit green light Lg, and the third pixel P3 may emit blue light Lb.

The first pixel P1, the second pixel P2, and the third pixel P3 may include a first display element OLED1, a second display element OLED2, and a third display element OLED3 each including an organic light-emitting diode OLED, respectively. In an exemplary embodiment, the first display element OLED1, the second display element OLED2, and the third display element OLED3 may emit blue light. In another exemplary embodiment, the first display element OLED1, the second display element OLED2, and the third display element OLED3 may emit red light, green light, and blue light, respectively.

The color filter unit CU may include filter portions 300R, 300G, and 300B. The light emitted from the first display element OLED1, the second display element OLED2, and the third display element OLED3 may be discharged from the display apparatus 1 as the red light Lr, the green light Lg, and the blue light Lb after passing through the filter portions 300R, 300G, and 300B, respectively.

The filter portions 300R, 300G, and 300B may be directly on an upper substrate 160. The filter portions 300R, 300G, and 300B may include the first color conversion layer 120R and a first filter layer 110R, the second color conversion layer 120G and a second filter layer 110G, and the transmission layer 120B and a third filter layer 110B, respectively, that will be described later with reference to FIG. 5.

Here, 'directly on the upper substrate 160' may denote that the first to third filter layers 110R, 110G, and 110B are directly formed on the upper substrate 160 when manufacturing the color filter unit CU. After that, the display unit DU and the color filter unit CU may be bonded to each other, while the first to third filter layers 110R, 110G, and 110B face the first pixel P1, the second pixel P2, and the third pixel P3, respectively. FIG. 2 shows that the display unit DU and the color filter unit CU are bonded to each other via an adhesive layer ADH. The adhesive layer ADH may include, for example, an optical clear adhesive ("OCA"), but the invention is not limited thereto. In another exemplary embodiment, the adhesive layer ADH may be omitted.

Before referring to FIG. 3, in an exemplary embodiment, the first and second color conversion layers 120R and 120G may include quantum dot material. A core of a quantum dot may be selected from a Group II-VI compound, a Group III-V compound, a Group IV-VI compound, a Group IV element, a Group IV compound, and a combination thereof.

The Group II-VI compound may be selected from the group consisting of: CdSe, CdTe, ZnS, ZnSe, ZnTe, ZnO, HgS, HgSe, HgTe, MgSe, MgS, and a binary compound selected from a group formed by mixtures thereof; AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a ternary compound selected from a group formed by mixtures thereof; and HgZnTeS, CdZnSeS, CdZnSeTe, CdZnSTe, CdHgSeS, CdHgSeTe, CdHgSTe, HgZnSeS, HgZnSeTe, HgZnSTe, and a quaternary compound selected from a group formed by mixtures thereof.

The Group III-V compound may be selected from the group consisting of: GaN, GaP, GaAs, GaSb, AlN, AlP, AlAs, AlSb, InN, InP, InAs, InSb and a binary compound selected from a group formed by mixtures thereof; GaNP, GaNAs, GaNSb, GaPAs, GaPSb, AlNP, AlNAs, AlNSb, AlPAs, AlPSb, InGaP, InNAs, InNP, InNAs, InNSb, InPAs, InPSb, GaAlNP, and a ternary compound selected from a group formed by mixtures thereof; and GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a quaternary compound selected from a group formed by mixtures thereof.

The Group IV-VI compound may be selected from the group consisting of: SnS, SnSe, SnTe, PbS, PbSe, PbTe, and a binary compound selected from a group formed by mixtures thereof; SnSeS, SnSeTe, SnSTe, PbSeS, PbSeTe, PbSTe, SnPbS, SnPbSe, SnPbTe, and a ternary compound selected from a group formed by mixtures thereof; and SnPbSSe, SnPbSeTe, SnPbSTe, and a quaternary compound selected from a group formed by mixtures thereof. The Group IV element may be selected from the group consisting of Si, Ge, and mixtures thereof. The Group IV compound may include a binary compound selected from the group consisting of SiC, SiGe, and mixtures thereof.

Here, the binary compound, the ternary compound, or the quaternary compound may be present in the particles in a uniform concentration, or may be present in the same particle with partially different concentration distributions. Also, the quantum dot may have a core/shell structure, in which one quantum dot surrounds another quantum dot. An interface between the core and the shell may have a concentration gradient in which a concentration of an element in the shell decreases towards a center of core.

In some exemplary embodiments, the quantum dot may have the core-shell structure including a core having a nano-crystal described above and a shell surrounding the core. The shell of the quantum dot may act as a protective layer for preventing chemical modification of the core and maintaining semiconductor characteristics and/or a charging layer for applying an electrophoretic characteristic to the quantum dot. The shell may have a single-layered structure or a multi-layered structure. An interface between the core and the shell may have a concentration gradient in which a concentration of an element in the shell decreases towards a center of the quantum dot. The shell of the quantum dot may include oxide of a metal or non-metal material, a semiconductor compound, or a combination thereof.

For example, the oxide of the metal or non-metal material may include, but is not limited to, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, etc., or a ternary compound such as $MgAl_2O_4$, $CoFe_2O_4$, $NiFe_2O_4$, $CoMn_2O_4$, etc.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but is not limited thereto.

The quantum dot may have a full width of half maximum ("FWHM") of the light emitting wavelength spectrum of about 45 nanometers (nm) or less, for example, about 40 nm or less, in particular, about 30 nm or less, and may improve color purity or color reproduction within the above range. Also, the light emitted from the quantum dot is omni-directional, and thus, an optical viewing angle may be increased.

The quantum dot may have any shape provided that the shape is generally in the field, and in particular, may be a spherical, pyramidal, multi-arm, or a cubic nanoparticle, or may be a nanotube, nanowire, nanofiber, or nanoplate particle, etc.

The quantum dot may adjust a color of emitting light according to a particle size thereof, and accordingly the quantum dot may emit various color light, e.g., blue light, red light, green light, etc.

Referring to FIG. 3, the first color conversion layer 120R converts blue incident light Lib into first color light Lr (e.g., red light Lr). The first color conversion layer 120R may include a first photosensitive polymer 123R in which first quantum dots 121R and first scattering particles 122R are dispersed.

The first quantum dots 121R are excited by the blue incident light Lib and may isotropically emit the first color light Lr having a longer wavelength than that of the blue light. The first photosensitive polymer 123R may include an organic material transmitting light. The first scattering particles 122R scatter the blue incident light Lib that is not absorbed by the first quantum dots 121R to make more first quantum dots 121R excited, and thus may increase a color conversion ratio of the first color conversion layer 120R. The first scattering particles 122R may include, for example, titanium oxide ($TiO_2$) or metal particles.

The second color conversion layer 120G converts the blue incident light Lib into the second color light Lg (e.g., green light Lg). The second color conversion layer 120G may include a second photosensitive polymer 123G in which second quantum dots 121G and second scattering particles 122G are dispersed.

The second quantum dots 121G are excited by the blue incident light Lib and may isotropically emit the second color light Lg having a longer wavelength than that of the blue light. The second photosensitive polymer 123G includes an organic material transmitting light and may include the same material as that of the first photosensitive polymer 123R. The second scattering particles 122G scatter the blue incident light Lib that is not absorbed by the second quantum dots 121G to make more second quantum dots 121G excited, and thus may increase a color conversion ratio of the second color conversion layer 120G. The second scattering particles 122G may include, for example, titanium oxide ($TiO_2$) or metal particles, and may include the same material as that of the first scattering particles 122R.

The transmission layer 120B transmits the blue incident light Lib and emits the blue light Lb towards the upper substrate 160. The transmission layer 120B may include a third photosensitive polymer 123B in which third scattering particles 122B are dispersed. The third photosensitive polymer 123B may include, for example, an organic material transmitting light, such as a silicon resin, an epoxy resin, etc., and may include the same material as those of the first and second photosensitive polymers 123R and 123G. The third scattering particles 122B may scatter and emit the blue incident light Lib and may include the same material as those of the first and second scattering particles 122R and 122G.

Figure 4:
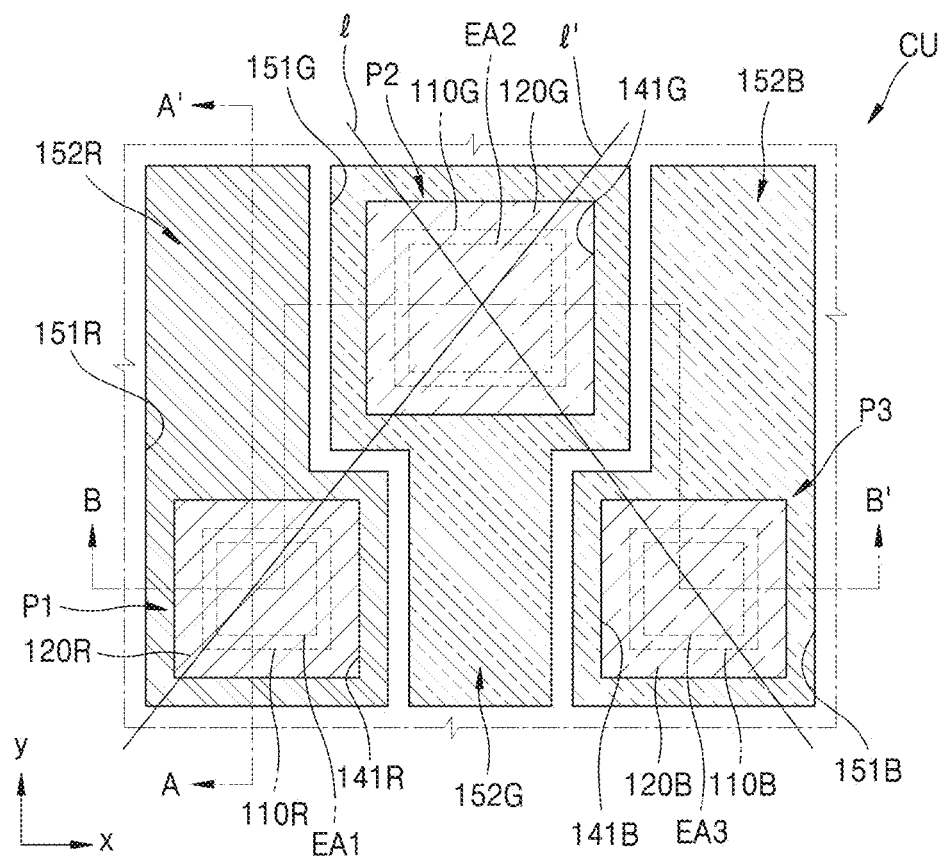
FIG. 4 is a plan view of a display apparatus according to an exemplary embodiment.
Figure 5:
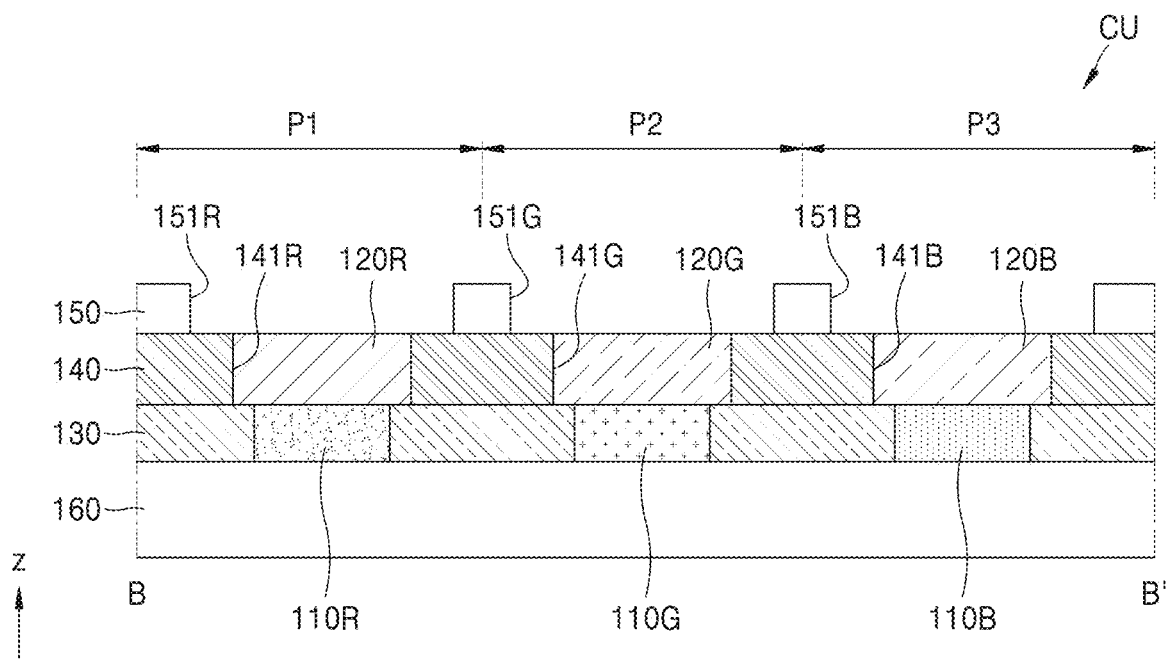
FIG. 5 is a cross-sectional view of a color filter unit according to an exemplary embodiment.

FIGS. 4 and 5 are a plan view and a cross-sectional view, respectively, partially showing a display apparatus according to an exemplary embodiment.

FIGS. 4 and 5 show a plan view and a cross-sectional view of the color filter unit CU, respectively, according to an exemplary embodiment, and FIG. 5 corresponds to a cross-section of the color filter unit CU taken along line B-B' of FIG. 4.

Referring to FIGS. 4 and 5, the display apparatus according to the exemplary embodiment includes the first pixel P1, the second pixel P2, and the third pixel P3 emitting different color lights from one another. In an exemplary embodiment, the first to third pixels P1, P2, and P3 may each include a display element such as an organic light-emitting diode OLED. Each of the first to third pixels P1, P2, and P3 may emit, for example, red light, green light, blue light, or white light through the organic light-emitting diode OLED.

As described above with reference to FIG. 2, the display apparatus 1 includes the color filter unit CU on the display unit DU. The color filter unit CU may include the upper substrate 160, a first insulating layer 150, a second insulating layer 140, a light-blocking layer 130, the first to third filter layers 110R, 110G, and 110B, the first and second color conversion layers 120R and 120G, and the transmission layer 120B.

Figure 10:
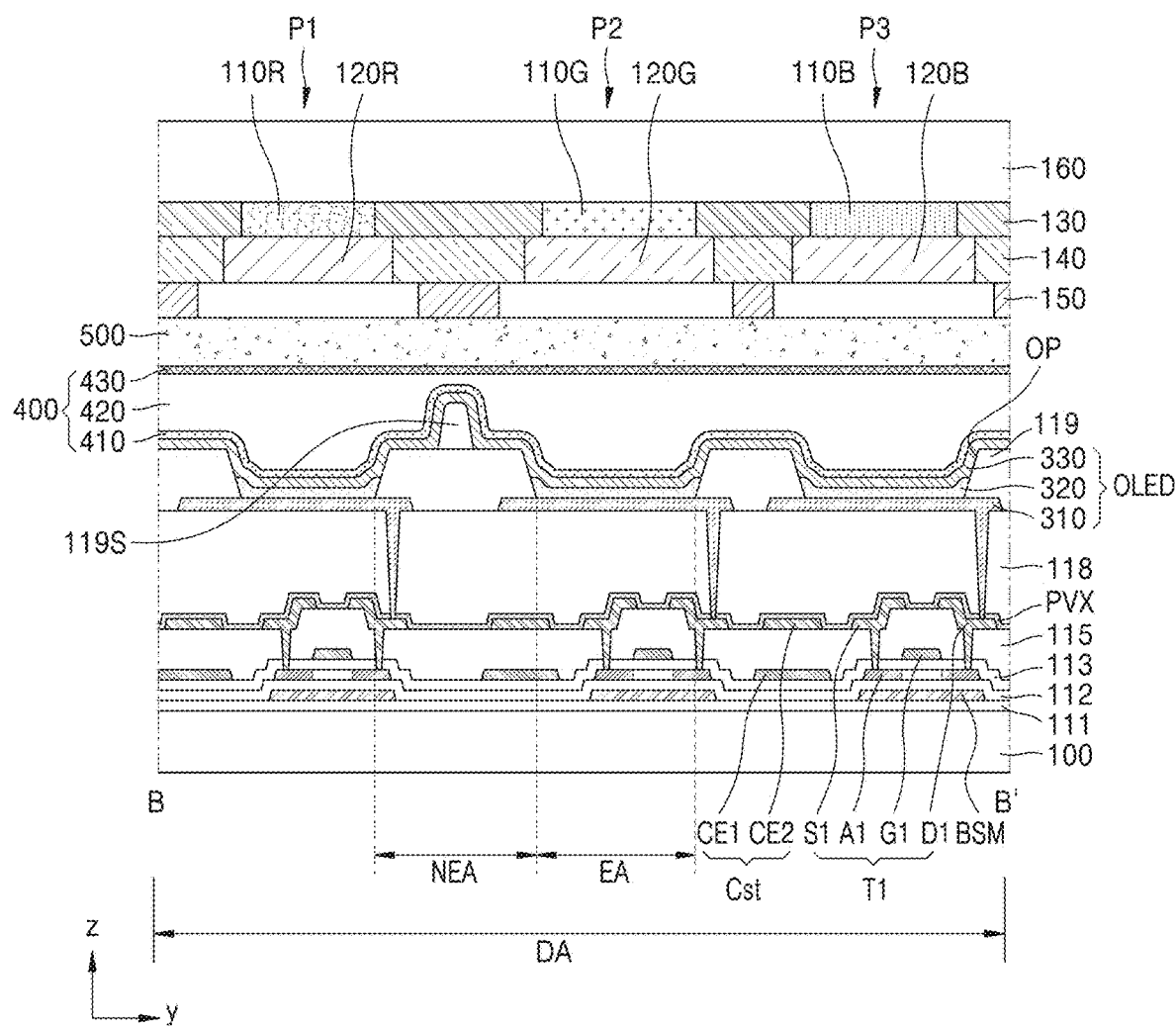
FIG. 10 is a cross-sectional view of a display apparatus according to an exemplary embodiment.

In FIG. 5, for convenience of description, it is described that various layers are stacked on the upper substrate 160 in a +Z direction, but the color filter unit CU according to the exemplary embodiment may be turned upside down to be attached to the display unit DU as shown in FIG. 10. Therefore, the layers will be described in a stacked order on the upper substrate 160.

In addition, it is assumed that the display apparatus according to the exemplary embodiment emits blue light via the organic light-emitting diode OLED, and thus, the transmission layer 120B rather than a color conversion layer may be disposed on the third filter layer 110B.

The upper substrate 160 may include a glass material, a ceramic material, a metal material, or a flexible or bendable material. When the upper substrate 160 is flexible or bendable, the upper substrate 160 may include a polymer resin such as a polyethersulfone, polyacrylate, polyetherimide, polyethylene naphthalate, polyethylene terephthalate, polyphenylene sulfide, polyarylate, polyimide, polycarbonate, or cellulose acetate propionate. The upper substrate 160 may have a single-layered or a multi-layered structure of the above material, and the multi-layered structure may further include an inorganic layer. In some exemplary embodiments, the upper substrate 160 may have a structure including an order of an organic material/inorganic material/organic material.

The light-blocking layer 130 and the first to third filter layers 110R, 110G, and 110B may be on one surface of the upper substrate 160.

The light-blocking layer 130 may be disposed among the first to third filter layers 110R, 110G, and 110B to correspond to a non-emitting area NEA (see FIG. 10). The light-blocking layer 130 may include a black matrix for improving color sharpness and contrast. The light-blocking layer 130 may include at least one selected from black pigment, black dye, and black particles. In some exemplary embodiments, the light-blocking layer 130 may include a material such as Cr or $CrO_X$, $Cr/CrO_X$, $Cr/CrO_X/CrN_Y$, a resin (e.g., carbon pigment, RGB mixture pigment), graphite, non-Cr based material, etc.

The first to third filter layers 110R, 110G, and 110B may include a red color filter, a green color filter, and a blue color filter, respectively. The light passing through the first to third filter layers 110R, 110G, and 110B may have an improved color reproducibility of red, green, and blue colors.

The second insulating layer 140 may define first to third openings 141R, 141G, and 141B exposing the first to third filter layers 110R, 110G, and 110B, respectively. The second insulating layer 140 may include, for example, an organic material. In an exemplary embodiment, the second insulating layer 140 may include a light-blocking material to function as a light-blocking layer. The light-blocking material may include, for example, at least one selected from black pigment, black dye, black particles, and metal particles.

The first and second color conversion layers 120R and 120G and the transmission layer 120B may be disposed in the first to third openings 141R, 141G, and 141B, respectively. The first and second color conversion layers 120R and 120G and the transmission layer 120B may have the structure of FIG. 3.

The first insulating layer 150 may define first to third opening portions 151R, 151G, and 151B exposing the first and second color conversion layers 120R and 120G and the transmission layer 120B, respectively. The first insulating layer 150 may include, for example, an organic material. In some cases, the first insulating layer 150 may include at least one selected from black pigment, black dye, black particles, and metal particles to function as a light-blocking layer.

The first to third pixels P1, P2, and P3 may include the first and second color conversion layers 120R and 120G and the transmission layer 120B, respectively, and may further include the first to third filter layers 110R, 110G, and 110B, respectively, (see dotted portions of FIG. 4) although not shown in the plan view.

The first opening portion 151R has a first extension portion 152R extending in a first direction (i.e., +Y direction in FIGS. 4 and 6) and at least partially exposing the second insulating layer 140. In an exemplary embodiment, a width W of the first extension portion 152R in the first direction (+Y direction) may be equal to or greater than twice a width of the first opening 141R in the first direction (+Y direction). However, the invention is not limited to the above example.

Although the first pixel P1 is described above, the second pixel P2 and the third pixel P3 may have the same structures as that of the first pixel P1. However, the second opening portion 151G of the second pixel P2 has a second extension portion 152G extending in a second direction (i.e., −Y direction in FIG. 4, a direction opposite to the first direction) and at least partially exposing the second insulating layer 140. In an exemplary embodiment, a width of the second extension portion 152G in the second direction (−Y direction) may be equal to or greater than twice a width of the second opening 141G in the second direction (−Y direction). However, the invention is not limited to the above example.

The first extension portion 152R, the second extension portion 152G, and the third extension portion 152B may have the same width.

A region in the first filter layer 110R, through which the light emitted from an emission layer of the display unit DU passes after passing through the first color conversion layer 120R, is referred to as a first emission area EA1 of the first pixel P1. The first emission area EA1 has an area that is equal to or less than that of the first filter layer 110R. The above structure may be also applied to the second pixel P2 and the third pixel P3, as well as the first pixel P1.

Referring to FIG. 4, the first emission area EA1 in the first pixel P1, a second emission area EA2 in the second pixel P2, and a third emission area EA3 of the third pixel P3 may each have a square shape. When the emission area has a square shape, the amount of light that is ineffective at opposite edges of the pixel may be reduced as compared with the case where the emission area has a rectangular shape, while the pixel area is the same as the case where the emission region has a rectangular shape. In more detail, the light emitted from the organic light-emitting diode OLED spreads in all directions. As the light spreads in all directions, the light reaches the openings formed in the second insulating layer 140. In a comparative example, the openings may have a rectangular shape. That is, the openings may have a width in a first direction (i.e., a Y direction) and a width in a second direction (i.e., an X direction) perpendicular to the first direction. Depending on the widths of the openings, different amounts of light may pass through the openings. The wider the openings, the greater the amount of light passing through the openings. Therefore, when the width in the first direction is greater than the width in the second direction, the amount of light emitted in the second direction may be less than the amount of light emitted in the first direction. However, when the openings formed in the second insulating layer 140 have a square shape like in one embodiment of the present invention, the width in the first direction and the width in the second direction are the same. Therefore, the amount of light emitted in the second direction and the amount of light emitted in the first direction are the same. Thus, reduction of the amount of light in a specific direction is prevented. Accordingly, it is possible to increase the amount of light passing through the openings, and the area of the pixel may be the same as in the case when the openings have a rectangular shape. When the openings have a rectangular shape, if the ratio of the vertical width to the horizontal width is 8:2, the area of the pixel is 16. As such, when the openings have a square shape, the ratio of the vertical width to the horizontal width may be 4:4, and the area of the pixel becomes 16 like in the case where the openings have a rectangular shape.

When the first emission area EA1 of the first pixel P1, the second emission area EA2 of the second pixel P2, and the third emission area EA3 of the third pixel P3 have the square shapes, the first to third emission areas EA1, EA2, and EA3 may be disposed such that extension lines connecting a center of one of the first to third emission areas EA1, EA2, and EA3 to centers of the other two emission areas may cross one another. As shown in FIG. 4, for example, a first extension line l connecting the center of the second emission area EA2 to the center of the first emission area EA1 and a second extension line l' connecting the center of the second emission area EA2 to the center of the third emission area EA3 may cross each other.

Figure 6:
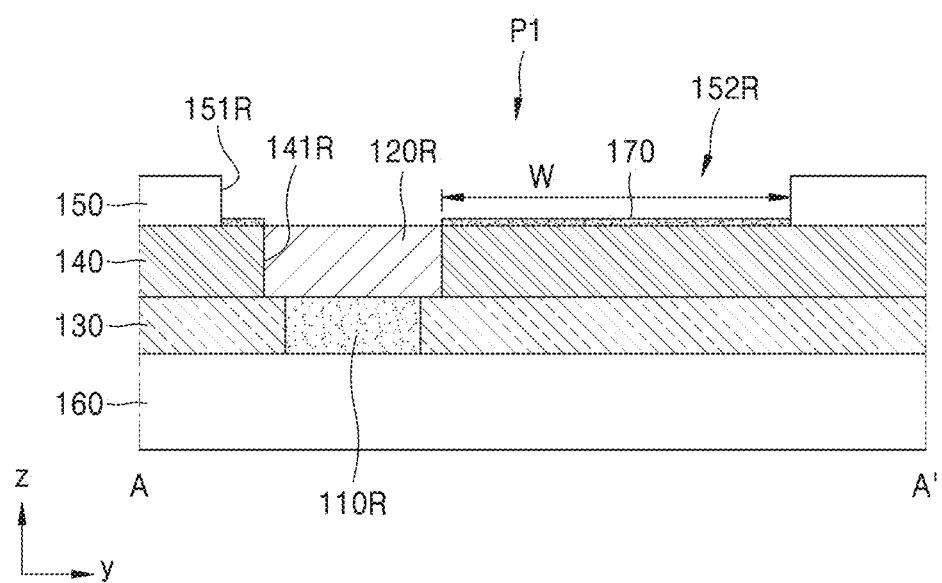
FIG. 6 is a cross-sectional view of a first pixel in a color filter unit according to an exemplary embodiment.

FIG. 6 is a cross-sectional view of the first pixel P1 in the color filter unit CU according to an exemplary embodiment.

In detail, FIG. 6 shows a cross-section of the first pixel P1 taken along line A-A' of FIG. 4.

The light-blocking layer 130, the first filter layer 110R, the first insulating layer 150, the second insulating layer 140, and the first color conversion layer 120R arranged in the first opening 141R and including the first quantum dots 121R (see FIG. 3) converting the incident light into first color light (e.g., the red light) may be on the upper substrate 160.

The first opening portion 151R has a first extension portion 152R extending in the first direction (i.e., +Y direction) and at least partially exposing the second insulating layer 140. In an exemplary embodiment, the width W of the first extension portion 152R in the first direction (i.e., +Y direction) may be equal to or greater than twice a width of the first opening 141R in the first direction (i.e., +Y direction). However, the invention is not limited to the above example.

FIG. 6 shows the cross-section of the first pixel P1, but the second pixel P2 and the third pixel P3 may have the same cross-sections as that of the first pixel P1. However, as shown in FIG. 4, the second opening portion 151G of the second pixel P2 has a second extension portion 152G extending in the second direction (i.e., −Y direction) and at least partially exposing the second insulating layer 140. In an exemplary embodiment, the width of the second extension portion 152G in the second direction (−Y direction) may be equal to or greater than twice a width of the second opening 141G in the second direction (−Y direction). However, the invention is not limited to the above example.

The first extension portion 152R, the second extension portion 152G, and the third extension portion 152B may have the same width.

In an exemplary embodiment, a surface 170 of the second insulating layer 140, where the surface 170 is exposed by the first extension portion 152R, may be hydrophobic. The surface 170 that is hydrophobic may be obtained by performing a gas plasma process using a gas including a halogen group element such as $CF_4$, $SF_6$, $NF_3$, etc. or a fluorine coating. Because the surface 170 of the second insulating layer 140 exposed by the first extension portion 152R is hydrophobic, the first color conversion layer 120R may be formed only in the first opening 141R in a process of manufacturing the first color conversion layer 120R. The process will be described later.

Figure 7:
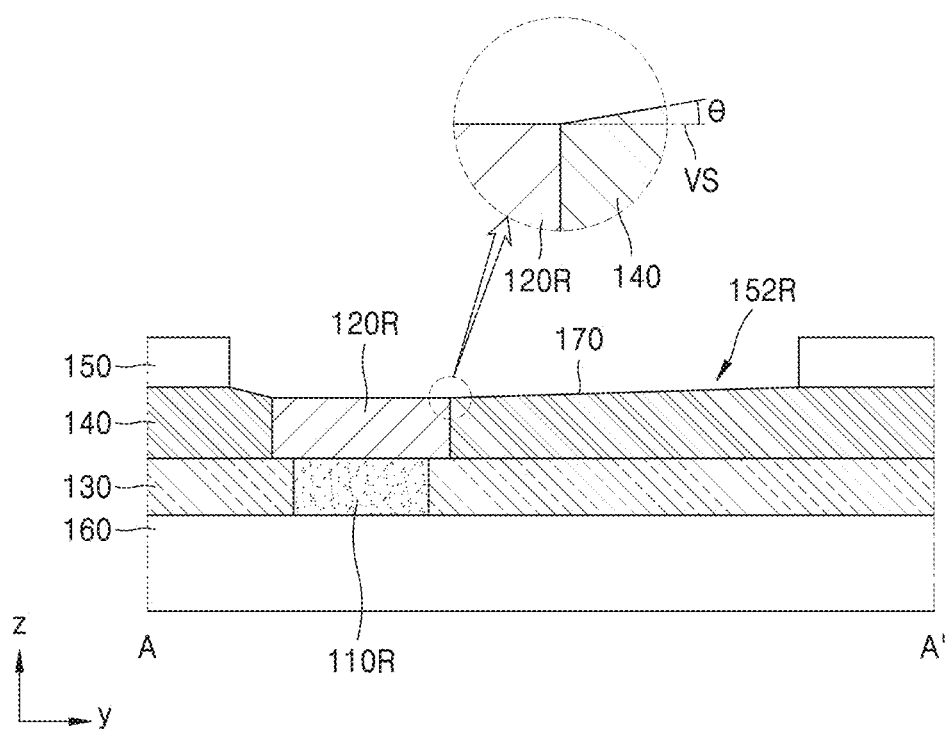
FIG. 7 is a cross-sectional view of a first extension in a color filter unit according to an exemplary embodiment.

FIG. 7 is a cross-sectional view of the color filter unit CU according to an exemplary embodiment.

FIG. 7 shows that the surface 170 of the second insulating layer 140, which is exposed by the first extension portion 152R, has an inclination in the color filter unit CU according to the exemplary embodiment.

Referring to FIG. 7, the structure of the color filter unit CU is as described above with reference to FIG. 6, and the surface 170 of the second insulating layer 140, which is exposed by the first extension portion 152R, may have inclination. Referring to the enlarged view of FIG. 7, a virtual line VS shown in the second insulating layer 140, where the virtual line VS extends from the first color conversion layer 120R, is in parallel with the upper substrate 160. The virtual line VS and the surface of the second insulating layer 140 may have a certain angle θ therebetween. The angle θ may be about 1° to 2°, and the invention is not limited thereto.

According to the exemplary embodiments illustrated with reference to FIGS. 6 and 7, effect without loss in terms of the time (i.e., tack time) taken for each manufacturing process may be achieved. In the exemplary embodiment, an inkjet printing method using nozzles may be used to form the first and second color conversion layers 120R and 120G and the transmission layer 120B. As described above with reference to FIG. 4, the first to third emission areas EA1, EA2, and EA3 of the first to third pixels P1, P2, and P3 may have square shapes. When the first to third emission areas EA1, EA2, and EA3 have the square shapes, the first to third filter layers 110R, 110G, and 110b, and the first and second color conversion layers 120R and 120G and the transmission layer 120B corresponding to the first to third emission areas EA1, EA2, EA3 may also have the square shapes even though sizes of the shapes may be different.

In a comparative example, different from the exemplary embodiment according to the invention, when the first extension portion 152R is not provided, the first opening portion may have a square shape, and in this case, the number of nozzles arranged in a row may be restricted, which may result in increase of the tack time for each manufacturing process and degradation of production yield.

Therefore, in the display apparatus according to the exemplary embodiment, the first opening portion 151R of the first insulating layer 150 in the color filter unit CU includes the first extension portion 152R, and when the surface 170 of the second insulating layer 140, where the surface 170 is exposed due to the first extension portion 152R, has hydrophobic property or inclination, a lot of nozzles arranged in a row (i.e., arranged in Y direction) may be used and thus effects without loss may be achieved in terms of the tack time for each manufacturing process.

Also, when the surface 170 of the second insulating layer 140, which is exposed by the first extension portion 152R, has the hydrophobic property or inclination, the ink sprayed through the nozzles may flow into the first and second color conversion layers 120R and 120G, and thus, effect without loss may be achieved in terms of materials.

Figure 8:
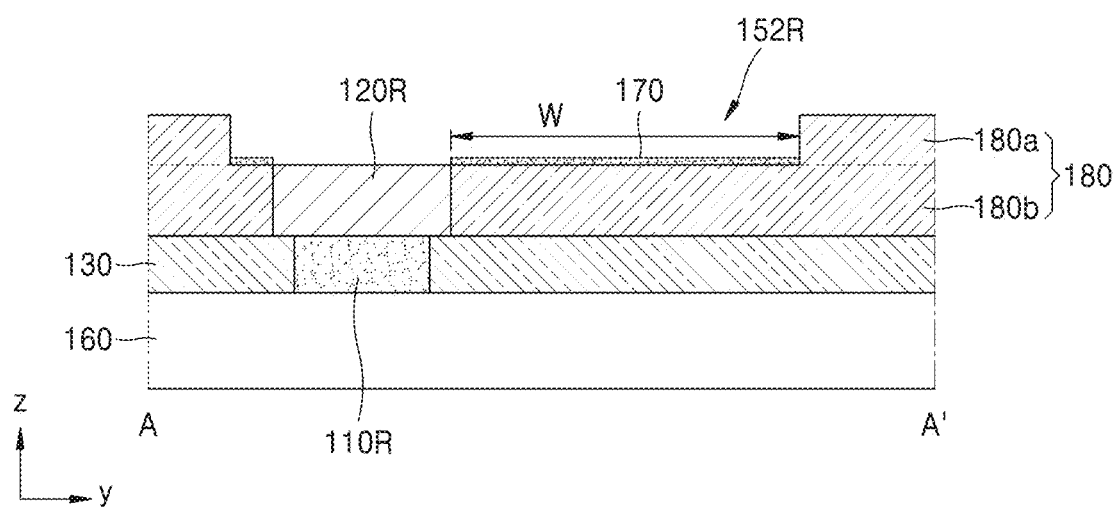
FIGS. 8 and 9 are cross-sectional views of a color filter unit according to another exemplary embodiment.
Figure 9:
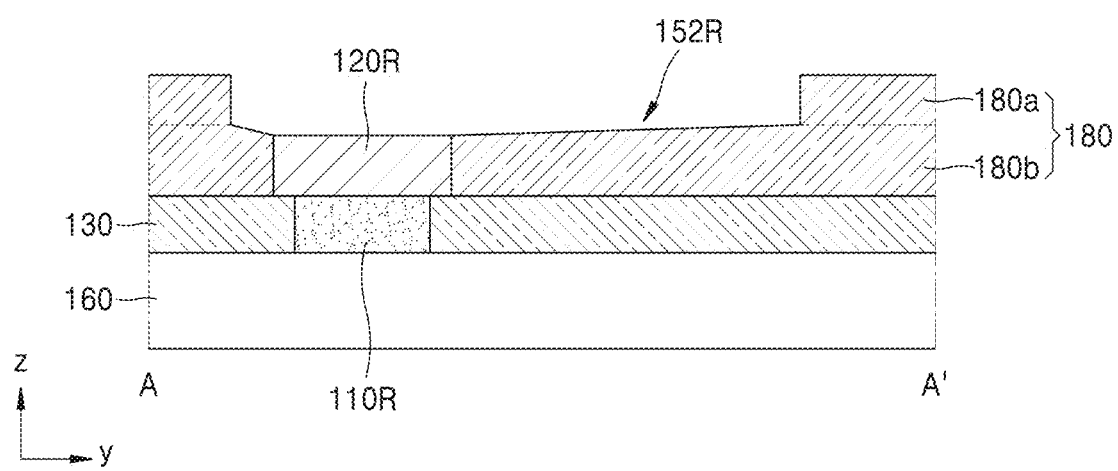

FIGS. 8 and 9 are cross-sectional views of the color filter unit CU according to another exemplary embodiment.

In detail, FIGS. 8 and 9 show a structure of the color filter unit CU, in which the first insulating layer and the second insulating layer are integrally provided.

Referring to FIGS. 8 and 9, the first insulating layer 150 and the second insulating layer 140 may be integrated, different from FIGS. 6 and 7 in which the first insulating layer 150 and the second insulating layer 140 are separated from each other. For example, the first insulating layer 150 and the second insulating layer 140 may be simultaneously manufactured through a same process using a half-tone mask.

The light-blocking layer 130, the first filter layer 110R, an integrated insulating layer 180, and the first color conversion layer 120R provided in the first opening 141R may be disposed on the upper substrate 160. Here, the integrated insulating layer 180 includes a lower layer 180b corresponding to the second insulating layer 140 and an upper layer 180a corresponding to the first insulating layer 150. The first opening portion 151R may include the first extension portion 152R that extends in the first direction (+Y direction) and at least partially exposes a lower layer 180b of the integrated insulating layer 180. In an exemplary embodiment, a width W of the first extension portion 152R in the first direction (+Y direction) may be equal to or greater than twice a width of the first opening 141R in the first direction (+Y direction). However, the invention is not limited to the above example.

The first extension portion 152R, the second extension portion 152G, and the third extension portion 152B may have the same width, but the invention is not limited thereto.

FIG. 8 shows the same structure as that of FIG. 6 except that the first insulating layer 150 and the second insulating layer 140 are integrated, and thus, the surface 170 of the lower layer 180b of the integrated insulating layer 180 may have hydrophobic property, where the surface 170 is exposed by the first extension portion 152R. The surface that is hydrophobic may be obtained by performing a gas plasma process using a gas including a halogen group element such as $CF_4$, $SF_6$, $NF_3$, etc. or a fluorine coating.

FIG. 9 shows the same structure as that of FIG. 7 except that the first insulating layer 150 and the second insulating layer 140 are integrated, and thus, the surface 170 of the lower layer 180b of the integrated insulating layer 180 may have inclination, where the surface 170 is exposed by the first extension portion 152R.

Also, the integrated insulating layer 180 may include a light-blocking material.

FIG. 10 is a cross-sectional view of a display apparatus according to an exemplary embodiment.

Referring to FIG. 10, at least one thin film transistor T1 and a display device connected to the thin film transistor T1 may be on the display area DA of the display apparatus according to the exemplary embodiment.

In the exemplary embodiment, the display area DA of the display apparatus includes the plurality of first to third pixels P1, P2, and P3, and each of the first to third pixels P1, P2, and P3 includes an emission area EA. The emission area EA may be a region in which light is generated and emitted to the outside. The non-emission area NEA is between the emission areas EA, and the emission areas EA of the first to third pixels P1, P2, and P3 may be partitioned by the non-emission area NEA.

The first pixel P1, the second pixel P2, and the third pixel P3 may emit different color light from one another. For example, the first pixel P1 may emit red light, the second pixel P2 may emit green light, and the third pixel P3 may emit blue light. In a plan view, the emission area EA of each pixel may have various polygonal shapes or circular shape, and the emission areas EA may be arranged variously, e.g., stripe arrangement, Pentile arrangement, etc.

In addition, the display apparatus according to the exemplary embodiment may include the first and second color conversion layers 120R and 120G and the transmission layer 120B corresponding to the emission areas EA of the first to third pixels P1, P2, and P3, respectively. The first and second color conversion layers 120R and 120G may include quantum dots and metal nano-particles, and the transmission layer 120B may include metal nano-particles.

For example, the first pixel P1 may include the first color conversion layer 120R, the second pixel P2 may include the second color conversion layer 120G, and the third pixel P3 may include the transmission layer 120B.

In the exemplary embodiment, average sizes of the quantum dots included in the first and second color conversion layers 120R and 120G may be different from each other.

Hereinafter, the display apparatus of the exemplary embodiment will be described in detail according to the stacked order in FIG. 10.

FIG. 10 shows a thin film transistor T1 and a storage capacitor Cst of a pixel circuit in each pixel P in the display area DA. For example, the thin film transistor T1 may be a driving thin film transistor or a switching thin film transistor. For convenience of description, elements in the display area DA of FIG. 10 will be described according to a stacking order.

The substrate 100 may include a glass material, a ceramic material, a metal material, or a flexible or bendable material. When the substrate 100 is flexible or bendable, the substrate 100 may include a polymer resin such as a polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a single-layered or a multi-layered structure of the above material, and the multi-layered structure may further include an inorganic layer. In an exemplary embodiment, the substrate 100 may have a structure including an order of organic material/inorganic material/organic material.

A barrier layer (not shown) may be further provided between the substrate 100 and a first buffer layer 111. The barrier layer may prevent or reduce infiltration of impurities from the substrate 100, etc. into a semiconductor layer A1. The barrier layer may include an inorganic material such as an oxide material or a nitride material, an organic material, or an inorganic-organic composite material, and may have a single-layered or multi-layered structure including the inorganic material and the organic material.

A bias electrode BSM may be on the first buffer layer 111 to correspond to the thin film transistor T1. A voltage may be applied to the bias electrode BSM. Also, the bias electrode BSM may prevent external light from reaching the semiconductor layer A1. Accordingly, characteristics of the thin film transistor T1 may be stabilized. The bias electrode BSM may be omitted in some cases.

The semiconductor layer A1 may be on a second buffer layer 112. The semiconductor layer A1 may include amorphous silicon or polysilicon. In another exemplary embodiment, the semiconductor layer A1 may include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), aluminum (Al), cesium (Cs), cerium (Ce), and zinc (Zn). In some exemplary embodiments, the semiconductor layer A1 may include Zn oxide-based material, e.g., Zn oxide, In—Zn oxide, Ga—In—Zn oxide, etc. In another exemplary embodiment, the semiconductor layer A1 may include In—Ga—Zn—O ("IGZO"), In—Sn—Zn—O ("ITZO"), or In—Ga—Sn—Zn—O ("IGTZO") semiconductor including ZnO with metal such as In, Ga, and Zn. The semiconductor layer A1 may include a channel region and a source region and a drain region at opposite sides of the channel region. The semiconductor layer A1 may have a single-layered or multi-layered structure.

A gate electrode G1 is over the semiconductor layer A1 with a gate insulating layer 113 therebetween, and the gate electrode G1 at least partially overlaps the semiconductor layer A1 in a plan view. The gate electrode G1 may include molybdenum (Mo), aluminum (Al), copper (Cu), titanium (Ti), etc., and may have a single-layered or multi-layered structure. As an example, the gate electrode G1 may include a single layer including Mo. A first electrode CE1 of the capacitor Cst is disposed at the same layer as the gate electrode G1. The first electrode CE1 may include the same material as that of the gate electrode G1.

An interlayer insulating layer 115 may cover the gate electrode G1 and the first electrode CE1 of the storage capacitor Cst. The interlayer insulating layer 115 may include an insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

A second electrode CE2 of the storage capacitor Cst, a source electrode S1, a drain electrode D1, and a data line (not shown) may be on the interlayer insulating layer 115.

The second electrode CE2 of the storage capacitor Cst, the source electrode S1, the drain electrode D1, and the data line may include a conductive material including molybdenum (Mo), aluminum (Al), copper (Cu), titanium (Ti), etc. and may have a single-layered or multi-layered structure including the above materials. In one exemplary embodiment, the second electrode CE2, the source electrode S1, the drain electrode D1, and the data line has a multi-layered structure including an order of Ti/Al/Ti. The source electrode S1 and the drain electrode D1 may be connected to the source region or the drain region of the semiconductor layer A1 via contact holes.

The second electrode CE2 of the storage capacitor Cst overlaps the first electrode CE1 with the interlayer insulating layer 115 therebetween and forms a capacitance in a plan view. In this case, the interlayer insulating layer 115 may function as a dielectric layer of the storage capacitor Cst.

The second electrode CE2 of the storage capacitor Cst, the source electrode S1, the drain electrode D1, and the data line may be covered by an inorganic protective layer PVX.

The inorganic protective layer PVX may have a single-layered or multi-layered structure including silicon nitride ($SiN_x$) and silicon oxide ($SiO_x$). The inorganic protective layer PVX may be introduced to cover and protect some wirings on the interlayer insulating layer 115. In a partial area of the substrate 100 (e.g., a part of the peripheral area), wirings (not shown) manufactured with the data line through the same manufacturing process may be exposed. Exposed parts of the wirings may be damaged due to an etchant that is used in patterning of a pixel electrode 310 that will be described later. However, since the inorganic protective layer PVX according to the exemplary embodiment at least partially covers the data line and the wirings manufactured with the data line, damage to the wirings during the patterning of the pixel electrode 310 may be prevented.

A planarization layer 118 is on the inorganic protective layer PVX and the organic light-emitting diode OLED may be on the planarization layer 118.

The planarization layer 118 may include a single-layered or multi-layered structure including an organic material, and may provide a planarized upper surface. The planarization layer 118 may include a general universal polymer (benzocyclobutene ("BOB"), polyimide, hexamethyldisiloxane ("HMDSO"), polymethylmethacrylate ("PMMA"), or polystyrene ("PS")), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof.

In the display area DA of the substrate 100, the organic light-emitting diode OLED is on the planarization layer 118. The organic light-emitting diode OLED includes the pixel electrode 310, an intermediate layer 320 including an organic light-emitting layer, and an opposite electrode 330.

The pixel electrode 310 may be a (semi-)transmissive electrode or a reflective electrode. In some exemplary embodiments, the pixel electrode 310 may include a reflective layer including Ag, Mg, Al, Pt, Pd, Au, Ni, Nd, Ir, Cr, or a compound thereof, and a transparent or semi-transparent electrode layer disposed on the reflective layer. The transparent or semi-transparent electrode layer may include at least one selected from the group consisting of indium tin oxide ("ITO"), indium zinc oxide ("IZO"), zinc oxide ("ZnO"), indium oxide ("$In_2O_3$"), indium gallium oxide, and aluminum zinc oxide ("AZO"). In some exemplary embodiments, the pixel electrode 310 may include an order of ITO/Ag/ITO.

A pixel defining layer 119 may be on the planarization layer 118. Also, the pixel defining layer 119 increases a distance between an edge of the pixel electrode 310 and the opposite electrode 330 on the pixel electrode 310 to prevent generation of arc at the edge of the pixel electrode 310.

The pixel defining layer 119 may include one or more organic insulating materials selected from the group consisting of polyimide, polyamide, acryl resin, BCB, and phenol resin, and may be manufactured by a spin coating method, etc.

The intermediate layer 320 of the organic light-emitting diode OLED may include an organic light-emitting layer. The organic light-emitting layer may include an organic material including a fluorescent or phosphor material emitting red, green, blue, or white light. The organic light-emitting layer may include a low-molecular organic material or a polymer organic material, and functional layers such as a hole transport layer ("HTL"), a hole injection layer ("HIL"), an electron transport layer ("ETL"), and an electron injection layer ("EIL") may be selectively arranged under and on the organic light-emitting layer. The intermediate layer 320 may be provided as a several pieces such that each piece corresponds to each of a plurality of pixel electrodes 310. However, the invention is not limited thereto. The intermediate layer 320 may be variously modified, that is, may be provided as monolithic to cover the plurality of pixel electrodes 310.

In the drawings, the intermediate layer 320 is provided for each of the first to third pixels P1, P2, and P3, but the invention is not limited thereto. The intermediate layer 320 may be integrally formed as monolithic with respect to the first to third pixels P1, P2, and P3.

In the exemplary embodiment, the organic light-emitting diodes OLED included in the first to third pixels P1, P2, and P3 may include the organic light-emitting layers emitting the same color light. For example, the organic light-emitting diodes OLED included in the first to third pixels P1, P2, and P3 may all emit blue light.

The opposite electrode 330 may be a transmissive electrode or a reflective electrode. In some exemplary embodiments, the opposite electrode 330 may be a transparent or a semi-transparent electrode, and may be provided as a metal thin film including Li, Ca, LiF/Ca, LiF/Al, Al, Ag, Mg, or a compound thereof having a small work function. Also, a transparent conductive oxide ("TCO") layer such as ITO, IZO, ZnO, or $In_2O_3$ may be further provided over the metal thin film. The opposite electrode 330 is arranged throughout the display area DA and a peripheral area PA, and on the intermediate layer 320 and the pixel defining layer 119. The opposite electrode 330 may be provided integrally with respect to the plurality of organic light-emitting diodes OLED to correspond to the plurality of pixel electrodes 310.

A spacer 119S may be further provided on the pixel defining layer 119 for preventing a mask dent. The spacer 119S may be integrally manufactured with the pixel defining layer 119. For example, the spacer 119S and the pixel defining layer 119 may be manufactured simultaneously in the same process by using a halftone mask process.

Because the organic light-emitting diode OLED is easily damaged by external moisture or oxygen, the organic light-emitting diode OLED may be covered and protected by a thin film encapsulation layer 400. The thin film encapsulation layer 400 covers the display area DA and may extend to the outside of the display area DA. The thin film encapsulation layer 400 includes at least one organic encapsulation layer and at least one inorganic encapsulation layer. For example, the thin film encapsulation layer 400 may include a first inorganic encapsulation layer 410, an organic encapsulation layer 420, and a second inorganic encapsulation layer 430.

The first inorganic encapsulation layer 410 covers the opposite electrode 330 and may include silicon oxide, silicon nitride, and/or silicon trioxynitride. Although not shown in the drawings, other layers such as a capping layer may be provided between the first inorganic encapsulation layer 410 and the opposite electrode 330, if necessary. Since the first inorganic encapsulation layer 410 is formed along a structure thereunder, the first inorganic encapsulation layer 410 has an uneven upper surface. The organic encapsulation layer 420 covers the first inorganic encapsulation layer 410, and unlike the first inorganic encapsulation layer 410, the organic encapsulation layer 420 may have a flat upper surface. In detail, the organic encapsulation layer 420 may planarize the upper surface of a portion corresponding to the display area DA. The organic encapsulation layer 420 may include one or more materials selected from the group consisting of polyethylene terephthalate, polyethylene naphthalate, polycarbonate, polyimide, polyethylene sulfonate, polyoxymethylene, polyarylate, and hexamethyl disiloxane. The second inorganic encapsulation layer 430 may cover the organic encapsulation layer 420, and may include silicon oxide, silicon nitride, and/or silicon trioxynitride.

Even when cracks occur in the thin film encapsulation layer 400, the cracks may be disconnected between the first inorganic encapsulation layer 410 and the organic encapsulation layer 420 or between the organic encapsulation layer 420 and the second inorganic encapsulation layer 430 owing to the multi-layered structure in the thin film encapsulation layer 400. As such, generation of an infiltration path through which the external moisture or oxygen passes to the display area DA may be prevented or reduced.

In the exemplary embodiment, the first and second color conversion layers 120R and 120G and the transmission layer 120B may be on the upper substrate 160 facing the substrate 100.

The display device has been described, but the disclosure is not limited thereto. For example, a method of manufacturing the display device may be also included in the scope of the disclosure.

FIGS. 11A to 11F are cross-sectional views illustrating processes in a method of manufacturing a display apparatus, according to an exemplary embodiment.

FIGS. 11A to 11E illustrate processes of forming the color filter unit CU with reference to FIG. 6. In FIGS. 11A to 11E, for convenience of description, it is described that various layers are stacked on the upper substrate 160 in a +Z direction, but the completely made color filter unit CU according to the exemplary embodiment may be turned upside down to be attached to the display unit DU as shown in FIG. 11F. Therefore, the layers will be described in a stacked order on the upper substrate 160. FIGS. 11A to 11E illustrate manufacturing processes based on the first pixel P1, but the second pixel P2 and the third pixel P3 may be also manufactured through the same manufacturing processes with those of the first pixel P1.

Figure 11A:
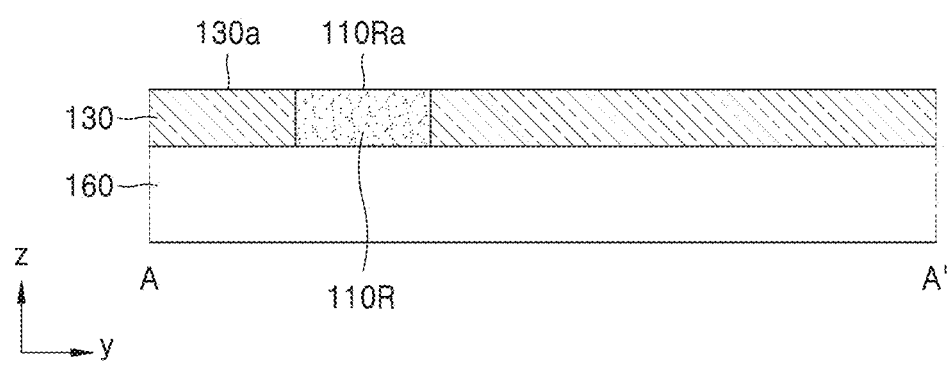
FIGS. 11A to 11F are cross-sectional views illustrating processes of a method of manufacturing a display apparatus, according to an exemplary embodiment.

FIG. 11A is a cross-sectional view showing a state in which the light-blocking layer 130 and the first filter layer 110R are formed on the upper substrate 160.

Referring to FIG. 11A, the light-blocking layer 130 and the first filter layer 110R may be formed on the upper substrate 160. In an exemplary embodiment, the light-blocking layer 130 defining a hole is formed and the first filter layer 110R is formed in the hole of the light-blocking layer 130. The upper substrate 160 may include a glass material, a ceramic material, a metal material, or a flexible or bendable material. In addition, the upper substrate 160 may have a single-layered or multi-layered structure including the above-stated materials.

The light-blocking layer 130 may be among the first to third filter layers 110R, 110G, and 110B to correspond to the non-emitting area NEA. The light-blocking layer 130 may include a black matrix and may improve color sharpness and contrast. The light-blocking layer 130 may include at least one selected from black pigment, black dye, and black particles. In some exemplary embodiments, the light-blocking layer 130 may include a material such as Cr or $CrO_X$, $Cr/CrO_X$, $Cr/CrO_X/CrN_Y$, a resin (e.g., carbon pigment, RGB mixture pigment), graphite, non-Cr based material, etc.

Different from FIG. 11A, there may be a height difference between an upper surface 130a of the light-blocking layer 130 and an upper surface 110Ra of the first filter layer 110R in another exemplary embodiment. For example, a height of the upper surface 110Ra of the first filter layer 110R may be greater than that of the upper surface 130a of the light-blocking layer 130, or the upper surface 110Ra and the upper surface 130a may overlap each other.

Figure 11B:
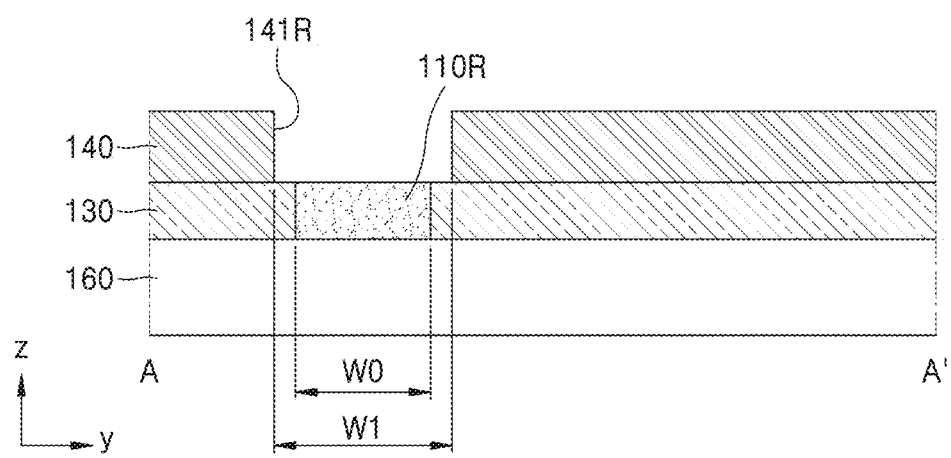

FIG. 11B is a cross-sectional view showing a state after the second insulating layer 140 is formed on the light-blocking layer 130 of FIG. 11A.

Referring to FIG. 11B, a width W1 of the first opening 141R in the first direction (i.e., +Y direction) may be greater than a width W0 of the first filter layer 110R in the first direction (i.e., +Y direction).

In addition, the second insulating layer 140 may include a light-blocking material. The light-blocking material may include, for example, at least one selected from black pigment, black dye, black particles, and metal particles.

Figure 11C:
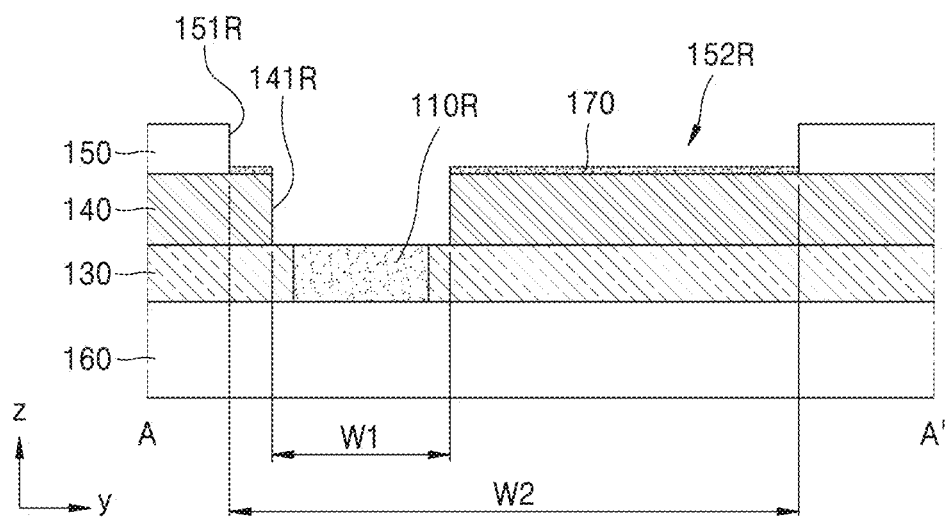

FIG. 11C is a cross-sectional view showing a state after the first insulating layer 150 is formed on the second insulating layer 140 of FIG. 11B and the surface 170 of the second insulating layer 140 exposed by the first extension portion 152R is formed to have hydrophobic property.

Referring to FIG. 11C, a width W2 of the first opening portion 151R in the first direction (i.e., +Y direction) may be greater than the width W1 of the first opening 141R in the first direction (i.e., +Y direction).

The surface 170 of the second insulating layer 140, where the surface 170 is exposed by the first extension portion 152R, may be formed by a gas plasma process using a gas including a halogen group element such as $CF_4$, $SF_6$, $NF_3$, etc. or by a fluorine coating. Remaining surface of the second insulating layer 140, which is exposed due to a difference between the first opening portion 151R and the first opening 141R, may also have the hydrophobic property.

FIG. 11C shows an example in which the surface 170 of the second insulating layer 140 exposed by the first extension portion 152R has the hydrophobic property, and thus, the surface 170 may be inclined as shown in FIG. 7. Also, as shown in FIGS. 8 and 9, the first insulating layer 150 and the second insulating layer 140 may be integrated with each other. For example, the first insulating layer 150 and the second insulating layer 140 may be simultaneously manufactured through a same process using a half-tone mask.

Figure 11D:
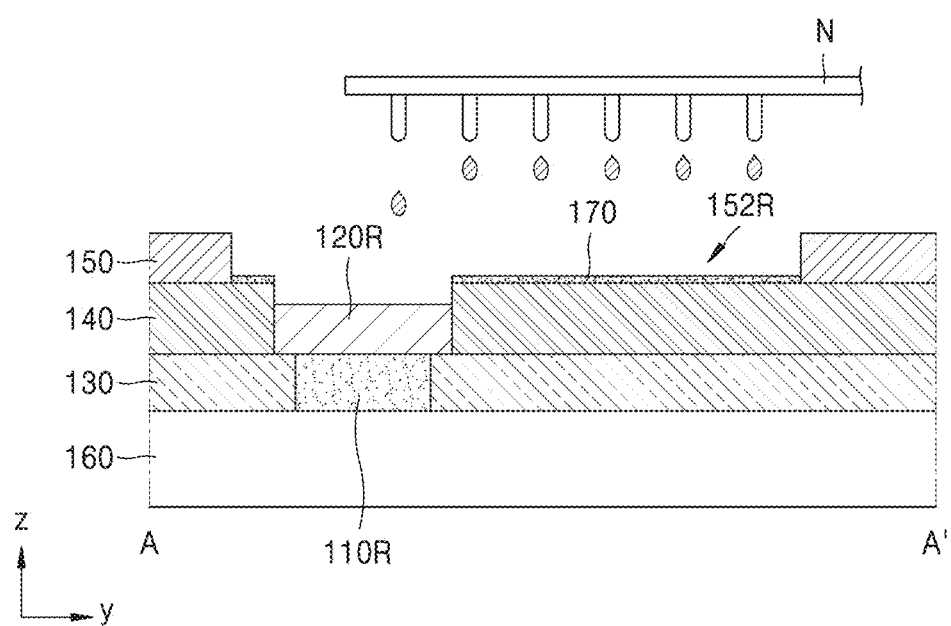

FIG. 11D is a cross-sectional view showing a state in which the first color conversion layer 120R is formed by using a nozzle N in the first opening 141R defined in the second insulating layer 140.

Due to the surface having the hydrophobic property formed in FIG. 11C, the ink sprayed from the nozzle N does not stay on the surface 170 of the second insulating layer 140, which is exposed by the first extension portion 152R, but flows into the first opening 141R, as shown in FIG. 11D. However, the invention is not limited thereto, that is, as described above, besides the surface having the hydrophobic property, other various ways, e.g., an inclined surface, etc. may be used.

Figure 11E:
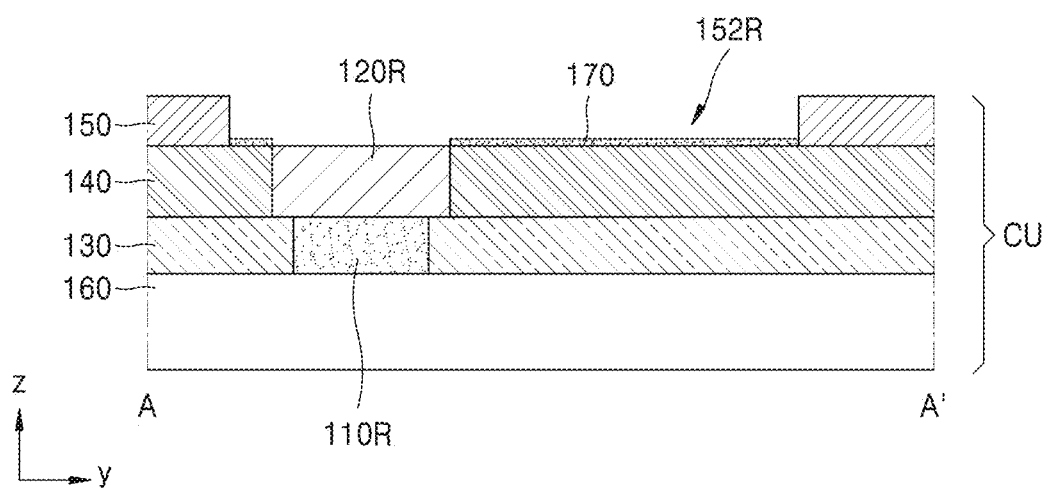
Figure 11F:
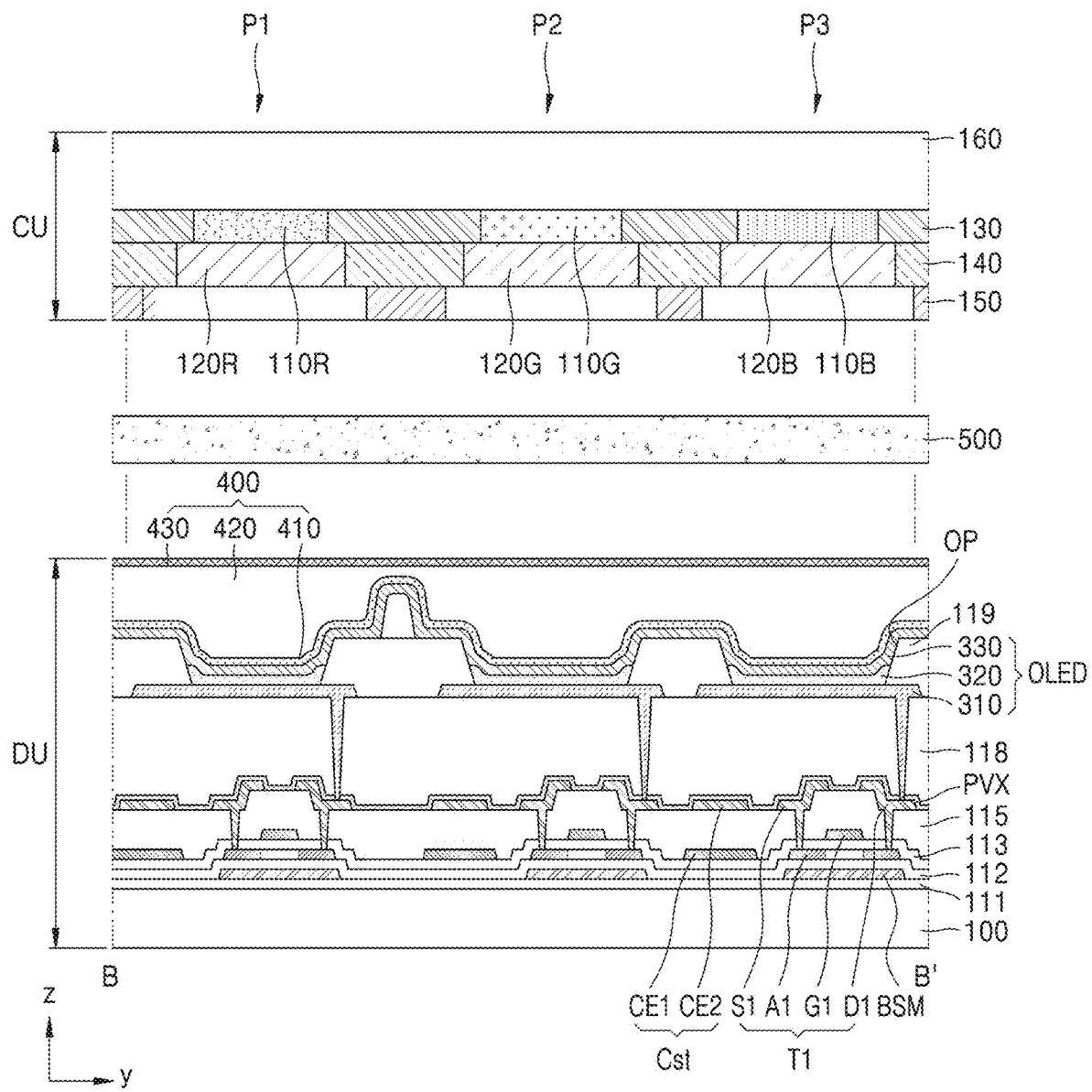

FIG. 11E is a cross-sectional view showing a state after forming the first color conversion layer 120R, and FIG. 11F is a cross-sectional view showing a state in which the color filter unit CU formed through the processes shown in FIGS. 11A to 11E is bonded to the display unit DU.

A filler 500 may be further provided between the substrate 100 and the upper substrate 160. The filler 500 may buffer external pressure, etc. The filler 500 may include an organic material such as methyl silicone, phenyl silicone, polyimide, etc. However, one or more exemplary embodiments are not limited thereto, and the filler 500 may include an organic sealant such as a urethane-based resin, or an epoxy-based resin, an acryl-based resin, or an inorganic sealant such as silicone.

In the display apparatus according to the exemplary embodiment, the first opening portion 151R of the first insulating layer 150 in the color filter unit CU includes the first extension portion 152R, and when the surface 170 of the second insulating layer 140, where the surface 170 is exposed due to the first extension portion 152R, has hydrophobic property or inclination, a lot of nozzles arranged in a row (arranged in Y direction) may be used and thus effects without loss may be achieved in terms of the tack time for each manufacturing process.

Also, when the surface 170 of the second insulating layer 140, which is exposed by the first extension portion 152R, has the hydrophobic property or inclination, the ink sprayed through the nozzles may flow into the first and second color conversion layers 120R and 120G, and thus, effect without loss may be achieved in terms of materials.

According to the exemplary embodiments above, the display apparatus having no loss in view of the time (i.e., tack time) for each manufacturing process and the method of manufacturing the display apparatus may be implemented. However, the scope of the disclosure is not limited to the above effects.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus, comprising:
a first pixel, a second pixel, and a third pixel which emit light of different colors from one another;
a first insulating layer on a first display element of the first pixel, the first insulating layer defining a first opening portion corresponding to the first display element;
a second insulating layer on the first insulating layer, the second insulating layer defining a first opening corresponding to the first opening portion;
a first color conversion layer disposed in the first opening, the first color conversion layer comprising first quantum dots for converting incident light into first color light; and
a first filter layer on the first color conversion layer,
wherein the first opening portion has a first extension portion which extends in a first direction and at least partially exposes the second insulating layer.

2. The display apparatus of claim 1, further comprising:
a second color conversion layer which corresponds to a second display element of the second pixel, the second color conversion layer comprising second quantum dots for converting the incident light into second color light; and
a second filter layer on the second color conversion layer,
wherein the first insulating layer further defines a second opening portion corresponding to the second display element of the second pixel,
the second insulating layer further defines a second opening corresponding to the second opening portion,
the second color conversion layer is located in the second opening, and
the second opening portion comprises a second extension portion which extends in a second direction opposite to the first direction and at least partially exposes the second insulating layer.

3. The display apparatus of claim 2, further comprising:
a transmission layer which corresponds to a third display element of the third pixel, the transmission layer comprising scattering particles for scattering the incident light; and
a third filter layer on the transmission layer,
wherein the first insulating layer further defines a third opening portion corresponding to the third display element of the third pixel,
the second insulating layer further defines a third opening corresponding to the third opening portion,
the transmission layer is located in the third opening, and
the third opening portion comprises a third extension portion which extends in the first direction and at least partially exposes the second insulating layer.

4. The display apparatus of claim 3, wherein the first extension portion, the second extension portion, and the third extension portion have a same width in the first direction or the second direction.

5. The display apparatus of claim 1, wherein a first emission area of the first pixel, a second emission area of the second pixel, and a third emission area of the third pixel have square shapes in a plan view.

6. The display apparatus of claim 5, wherein extension lines which connect a center of one of the first emission area, the second emission area, and the third emission area to centers of the other two emission areas cross one another in the plan view.

7. The display apparatus of claim 1, wherein at least one of the first insulating layer and the second insulating layer includes a light-blocking material.

8. The display apparatus of claim 1, wherein a surface of the second insulating layer, which is exposed by the first extension portion, has a hydrophobic property.

9. The display apparatus of claim 1, wherein a surface of the second insulating layer, which is exposed by the first extension portion, is inclined.

10. The display apparatus of claim 1, wherein the first insulating layer and the second insulating layer are integrally provided with each other.

11. The display apparatus of claim 10, wherein a surface of the second insulating layer, which is exposed by the first extension portion, has a hydrophobic property.

12. The display apparatus of claim 10, wherein a surface of the second insulating layer, which is exposed by the first extension portion, is inclined.

\* \* \* \* \*